(12) United States Patent
Kim et al.

(10) Patent No.: US 10,930,894 B2
(45) Date of Patent: Feb. 23, 2021

(54) ROLL TO ROLL FABRICATING SYSTEM HAVING TURNING UNIT

(71) Applicant: LG Display Co., Ltd., Seoul (KR)

(72) Inventors: Namkook Kim, Suwon-si (KR); Jejun Park, Seoul (KR); Seunglyul Lee, Paju-si (KR); Taejoon Song, Paju-si (KR); Shinbok Lee, Seoul (KR); Kyunghoon Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 172 days.

(21) Appl. No.: 15/690,040

(22) Filed: Aug. 29, 2017

(65) Prior Publication Data

US 2018/0151848 A1  May 31, 2018

(30) Foreign Application Priority Data

Nov. 28, 2016  (KR) .................. 10-2016-0159699

(51) Int. Cl.
| | |
|---|---|
| *C23C 14/56* | (2006.01) |
| *H01L 51/56* | (2006.01) |
| *H01L 51/00* | (2006.01) |
| *C23C 14/04* | (2006.01) |
| *C23C 16/04* | (2006.01) |
| *C23C 16/06* | (2006.01) |
| *C23C 16/448* | (2006.01) |

(Continued)

(52) U.S. Cl.
CPC ............ *H01L 51/56* (2013.01); *C23C 14/042* (2013.01); *C23C 14/562* (2013.01); *C23C 16/042* (2013.01); *C23C 16/06* (2013.01); *C23C 16/448* (2013.01); *C23C 16/463* (2013.01); *C23C 16/545* (2013.01); *H01L 51/0003* (2013.01)

(58) Field of Classification Search
CPC .................................................... C23C 16/545
See application file for complete search history.

(56) References Cited

U.S. PATENT DOCUMENTS 3,799,792 A * 3/1974 Ryng .................... C23C 14/562
427/255.5
3,954,213 A * 5/1976 Andersen ............... B65H 23/24
226/7

(Continued)

FOREIGN PATENT DOCUMENTS

| CN | 101578718 A | 11/2009 |
|---|---|---|
| CN | 102891165 A | 1/2013 |

(Continued)

OTHER PUBLICATIONS

Machine Translation of DE 10 2012 206 502 A1, retrieved 2019.*

(Continued)

*Primary Examiner* — David P Turocy
(74) *Attorney, Agent, or Firm* — Polsinelli PC

(57) ABSTRACT

In a roll to roll fabricating system, a plurality of deposition units are provided, and a turning unit is disposed between the deposition units. The deposition units include: a deposition drum on which a film is wound; and one or more evaporators disposed to face the deposition drum, and configured to deposit the film wound on the deposition drum. The turning unit includes a plurality of turning rolls, and is configured to turn the film output from one deposition unit, to guide the film, and to supply the film to another deposition unit.

4 Claims, 6 Drawing Sheets

(51) Int. Cl.
*C23C 16/46* (2006.01)
*C23C 16/54* (2006.01)

(56) References Cited

U.S. PATENT DOCUMENTS

| | | | | |
|---|---|---|---|---|
| 4,595,177 | A * | 6/1986 | Done | C23C 14/541 |
| | | | | 118/724 |
| 6,579,422 | B1 * | 6/2003 | Kakinuma | C23C 14/562 |
| | | | | 118/665 |
| 2008/0029640 | A1 * | 2/2008 | Chiu | B65H 23/0216 |
| | | | | 242/615.21 |
| 2008/0171422 | A1 * | 7/2008 | Tokie | H01L 51/001 |
| | | | | 438/479 |
| 2011/0283934 | A1 * | 11/2011 | Jadins | C23C 14/562 |
| | | | | 118/50 |
| 2012/0107487 | A1 * | 5/2012 | Cannella | C23C 14/042 |
| | | | | 427/66 |

FOREIGN PATENT DOCUMENTS

| | | |
|---|---|---|
| DE | 10 2012 206 502 A1 | 10/2013 |
| DE | 102012206502 A1 * | 10/2013 |
| DE | 10 2015 117344 A1 | 11/2016 |
| EP | 2113585 A1 * | 11/2009 ........... C23C 14/562 |

OTHER PUBLICATIONS

Office Action dated Mar. 4, 2019 with English translation issued in the corresponding Chinese Patent Application No. 201711156167.7, pp. 1-17.

Extended European Search Report dated Mar. 6, 2018 in corresponding application No. EP 17 20 2025.

European Office Action dated Dec. 18, 2019 issued in corresponding Application No. 17 202 025.7 (5 pages).

* cited by examiner

ROLL TO ROLL FABRICATING SYSTEM HAVING TURNING UNIT

CROSS-REFERENCE TO RELATED APPLICATION

Pursuant to 35 U.S.C. § 119(a), this application claims the benefit of an earlier filing date of and the right of priority to Korean Application No. 10-2016-0159699, filed on Nov. 28, 2016, the contents of which are incorporated by reference herein in its entirety.

BACKGROUND

Field of the Disclosure

The present disclosure relates to a display device, and more particularly, to a roll to roll fabricating system having a turning unit for fabricating a display device, capable of preventing damage of a deposited layer by preventing a deposition surface of a film from contacting a roll.

Description of the Background

Recently, a display device or a lighting device having an organic light emitting device has been proposed. The display device having an organic light emitting device is under the spotlight due to its advantages such as a higher response speed, a lower power consumption, a higher resolution and a larger screen than a liquid crystal display device or a plasma display device. Further, the lighting device having an organic light emitting device has better green and red light emitting efficiency and a relatively wider width of RGB light emitting peaks, than a display device having an inorganic light emitting device. Accordingly, the lighting device having an organic light emitting device has enhanced rendition, thereby having an advantage that its light is more similar to solar light.

Such an organic light emitting device includes an anode formed of a transparent oxide and disposed on a substrate formed of glass or plastic, an organic light emitting unit formed of a hole transporting layer, an organic light emitting layer, an electron transporting layer, an electron injecting layer, etc. which are sequentially laminated on the anode, and a cathode disposed on the organic light emitting unit.

In such an organic light emitting device, once a hole from the anode and an electron from the cathode are injected to the organic light emitting layer, an exciton is generated in the organic light emitting layer. As the exciton decays, generated is light corresponding to an energy difference between a lowest unoccupied molecular orbital (LUMO) and a highest occupied molecular orbital (HOMO) of a light emitting layer. Unlike a liquid crystal display device or a plasma display device, the organic light emitting device can be fabricated by relatively simple manufacturing processes because its main process includes a deposition process and an encapsulation process. This may allow the organic light emitting device to be fabricated rapidly, and may reduce fabrication costs.

However, the organic light emitting device has the following problems. Generally, an organic light emitting device is fabricated by depositing an anode, an organic light emitting layer and a cathode on a substrate formed of glass or plastic, and by performing an encapsulating process. Here, the anode, the organic light emitting layer and the cathode are deposited in a sheet to sheet manner. More specifically, a substrate having a preset size is loaded onto a deposition device by a transfer device such as a robot, thereby undergoing a deposition process. Then, the deposited substrate is transferred to a next deposition device by the transfer device, thereby undergoing a deposition process. As a result, the fabrication processes of the organic light emitting device are completed.

However, since the organic light emitting layer is formed of various layers such as a hole transporting layer, a light emitting layer, an electron transporting layer and an electron injecting layer, a plurality of deposition devices for forming a plurality of layers are required to form the organic light emitting device. Further, a plurality of transfer devices for transferring a substrate are required among the plurality of deposition devices. Since the transfer devices such as robots are expensive and occupy a large space, installation costs are significantly increased and a large installation space is required.

Further, in case of a sheet to sheet manner, deposition processes should be synchronized with each other, and a deposition process and a transfer process should be synchronized with each other. This may cause problems in performing consecutive deposition processes. Also, an expensive material can be lost due to an empty space of the deposition device (i.e., a non-loaded state of a substrate) which occurs when a substrate is transferred in the consecutive deposition processes.

SUMMARY

Therefore, an aspect of the present disclosure is to provide a roll to roll fabricating system capable of performing processes in a consecutive inline manner, by performing a deposition in a roll to roll manner.

Another aspect of the present disclosure is to provide a roll to roll fabricating system capable of preventing damage of a deposited layer by preventing a deposition surface of a film from contacting another structure, by arranging a turning unit having a plurality of turning rolls between a plurality of deposition units.

To achieve these and other advantages and in accordance with the purpose of this specification, as embodied and broadly described herein, there is provided a roll to roll fabricating system, comprising: a plurality of deposition units; and a turning unit disposed between the deposition units. The deposition units include: a deposition drum on which a film is wound; and one or more evaporators disposed to face the deposition drum, and configured to deposit the film wound on the deposition drum.

The deposition drum is formed of a material such as a metal having a high thermal conductivity, and cools the film having its temperature increased during a deposition process to prevent damage of the film due to a temperature increase. Further, a refrigerant passage is provided at the deposition drum to efficiently cool the film.

The turning unit includes a plurality of turning rolls, and is configured to turn the film output from one deposition unit, to guide the film, and to supply the film to another deposition unit. Since a deposition surface of the film turned by the turning unit does not contact any of the turning rolls, an inferiority of the film due to contact of the deposition surface may be prevented.

The plurality of turning rolls are moveably installed such that a relative distance there between is increased or decreased. As a movement of the turning rolls is determined according to a deposition time at the deposition unit, the plurality of deposition units are synchronized with each other.

In another aspect of the present disclosure, a roll to roll fabricating system includes a film supplying roll supplying a film; a film collecting roll collecting the film; first and second deposition units between the film supplying roll and the film collecting roll and forming a deposition material on the film; and guide rolls guiding the film between the first and second deposition units.

In a further aspect of the present disclosure, a roll to roll fabricating system includes a film supplying roll supplying a film; a film collecting roll collecting the film; first and second deposition units between the film supplying roll and the film collecting roll and forming a deposition material on the film; and at least one of a turning unit and first and second guide rolls between the first and second deposition units, wherein the turning unit turns a deposition surface of the film from the deposition units such that the deposition surface of the film is not contact with the rolls, and the first and second guide rolls guide the deposited film between the first and second deposition units.

In the present disclosure, since an organic light emitting device is fabricated by using the roll to roll fabricating system, a film is consecutively supplied by the film supplying roll, and at the same time processes are performed. This may allow a consecutive inline process, and allow the organic light emitting device to be fabricated rapidly.

Further, in the present disclosure, a plurality of deposition units having a deposition drum are provided to perform a deposition process in a state that a film is wound on the deposition drum. Especially, when a plurality of deposition units are provided, a turning unit is provided between the deposition units. This may prevent damage of a deposited layer resulting from contact between a deposition surface of the film and another roll, or deterioration of the film due to foreign materials.

Further, in the present disclosure, the film is cooled by the deposition drum disposed at the deposition unit. This may prevent a deformation and lowering of a tension of the film, due to a temperature increase during a deposition process.

Further scope of applicability of the present application will become more apparent from the detailed description given hereinafter. However, it should be understood that the detailed description and specific examples, while indicating various aspects of the disclosure, are given by way of illustration only, since various changes and modifications within the spirit and scope of the disclosure will become apparent to those skilled in the art from the present disclosure.

BRIEF DESCRIPTION OF THE DRAWINGS

The accompanying drawings, which are included to provide a further understanding of the disclosure and are incorporated in and constitute a part of the present disclosure, illustrate exemplary aspects and together with the description serve to explain the principles of the disclosure.

In the drawings.

DETAILED DESCRIPTION

Hereinafter, the present disclosure will be explained in more detail with reference to the attached drawings.

In the present disclosure, an organic light emitting device is fabricated by using a ductile plastic film. Especially, in the present disclosure, processes are performed in a roll to roll manner, not in a sheet to sheet manner, by using a bendable film. This may allow processes to be performed in a consecutive inline manner.

Figure 1:
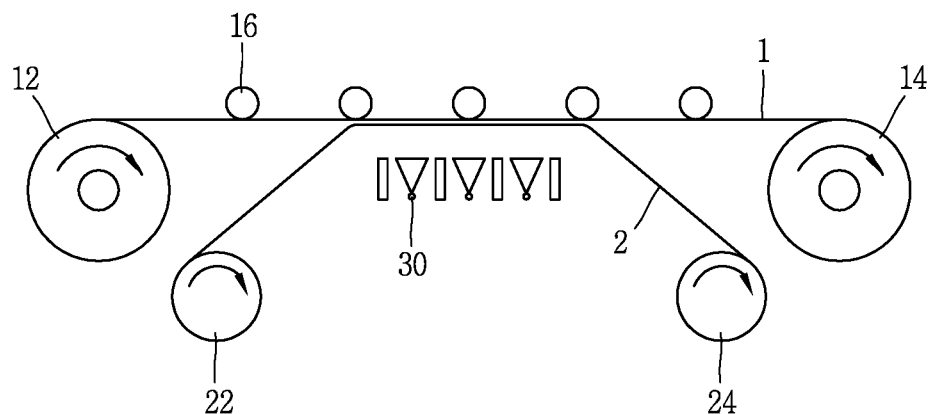
FIG. 1 is a schematic view showing a basic concept of a roll to roll fabricating system.

FIG. 1 is a schematic view schematically showing a deposition process in a roll to roll fabricating system according to the present disclosure.

As shown in FIG. 1, a general roll to roll fabricating system includes a film supplying roll 12 for supplying a ductile film 1 such as a plastic film, a film collecting roll 14 for collecting the film 1, a guide roll 16 for guiding the ductile film 1, a mask supplying roll 22 for supplying an open mask 2, a mask collecting roll 24 for collecting the open mask 2, and a deposition unit 30 such as an evaporator for forming a layer on the film by depositing an organic material or a metal.

In the roll to roll fabricating system, the ductile film 1 used as a substrate of a lighting device or a display device is transferred to the evaporator 30 from the film supplying roll 12, and the open mask 2 is transferred to the deposition unit 30 from the mask supplying roll 22. In a state that the open mask 2 is arranged on the entire surface of the ductile film 1, the deposition unit 30 deposits an organic material or a metal on a partial region of the film 1.

The open mask 2 having undergone the deposition process is separated from the film 1, the film 1 is collected by the film collecting roll 14, and the open mask 2 is collected by the mask collecting roll 24.

Although not shown, a driving shaft connected to an external driving means is provided at a central region of the film supplying roll 12, the film collecting roll 14, the mask supplying roll 22 and the mask collecting roll 24. As the external driving means is driven, the film supplying roll 12, the film collecting roll 14, the mask supplying roll 22 and the mask collecting roll 24 are rotated. Here, a driving of the film supplying roll 12 and the film collecting roll 14, and a driving of the mask supplying roll 22 and the mask collecting roll 24 are interworked with each other for synchronization. As a result, a process performing region of the film 1, i.e., a region where a lighting device or a display device is to be formed, is aligned with an open region of the open mask 2 above the deposition unit 30.

When an organic material or a metal is deposited on the film 1, it is deposited on the entire surface of the film 1. Accordingly, in order to deposit an organic material or a metal only on a preset region, regions except for the preset region should be blocked from the organic material or the metal to be deposited by the deposition unit 30. The open mask 2 serves to block a partial region when an organic material or a metal is deposited on the film 1, such that the organic material or the metal is deposited only on the preset region of the film 1.

The open mask 2 is formed to have the same width as the film 1, and an open region is formed at a position corresponding to a region where a lighting device or a display device is to be formed. With such a configuration, a deposition process is performed in a state that the open mask 2 is aligned with and attached onto the film 1.

In case of using the roll to roll fabricating system, since processes are performed by consecutively supplying the film 1 by the film supplying roll 12, the processes can be performed in a consecutive inline manner. This may allow a lighting device or a display device to be fabricated rapidly.

In the roll to roll fabricating system, the open mask 2 may be supplied in a sheet to sheet manner, not in a roll to roll manner. That is, when the film 1 is consecutively transferred by the film supplying roll 12 and the film collecting roll 14, a deposition may be performed as a sheet-shaped metal mask having an open region corresponding to a region where an organic light emitting device is to be formed, is adhered onto the film 1. However, in this case, the metal mask should be transferred and aligned by an additional transfer device such as a robot, separately from the film 1. This may cause a problem in substantially implementing an inline, even if the film 1 is transferred in real time by a roll.

In the roll to roll fabricating system according to the present disclosure, an inline can be substantially implemented because the open mask 2 as well as the film 1 is supplied and collected by rolls, and because the film 1 and the open mask 2 are interworked with each other.

Hereinafter, a roll to roll fabricating system according to an aspect of the present disclosure will be explained in more detail.

Figure 2:
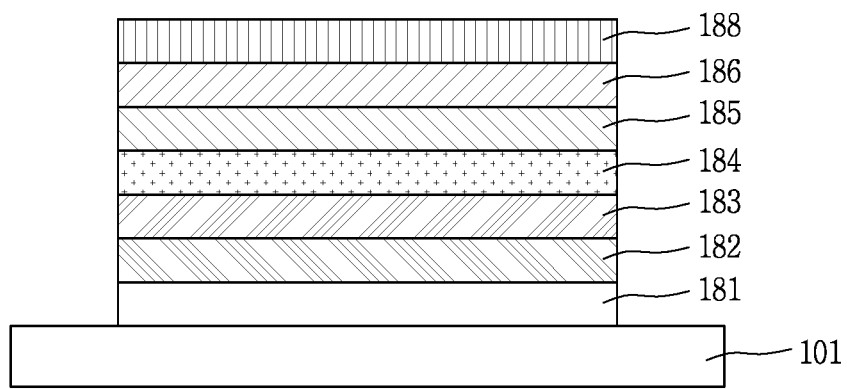
FIG. 2 is a cross-sectional view showing a structure of an organic light emitting device.

FIG. 2 is a cross-sectional view showing a structure of an organic light emitting device fabricated by a roll to roll fabricating system according to the present disclosure.

As shown in FIG. 2, an organic light emitting device according to the present disclosure includes an anode 181, a hole injecting layer 182 formed on the anode 181, a hole transporting layer 183 formed on the hole injecting layer 182 and configured to transport an injected hole, an organic light emitting layer 184 formed on the hole transporting layer 183, an electron transporting layer 185 disposed on the organic light emitting layer 184, an electron injecting layer 186 disposed on the electron transporting layer 185, and a cathode 188.

The hole injecting layer 182, the hole transporting layer 183, the electron transporting layer 185, and the electron injecting layer 186 are provided to enhance light emitting efficiency of the organic light emitting layer 184. At least one of the hole injecting layer 182, the hole transporting layer 183, the electron transporting layer 185, and the electron injecting layer 186 may be omitted according to a structure or a characteristic of the organic light emitting layer 184. Alternatively, another layer may be further provided. However, the present disclosure is not limited to this.

Generally, holes have a higher carrier mobility than electrons within an organic material, due to an ionization potential, an electron affinity, etc. That is, since electrons cannot easily move within an organic material, an exciton is generated near an electrode. However, a nonradiative decay is large near an electrode, quantum efficiency of an organic light emitting device is lowered. Accordingly, in order to enhance efficiency of a device, a sufficient amount of electrons and holes should be injected into an organic light emitting layer in an equilibrium state. An ideal light emitting device is formed such that a Fermi level of a metal electrode is identical to a HOMO and LUMO level of a light emitting material.

In order to make a Fermi level of a metal electrode and a HOMO and LUMO level of a light emitting material equal to each other, a light emitting device is formed to have a heterostructure by using two or more organic materials having different band gaps. Such a hetero structure is provided with the hole injecting layer 182 and the electron injecting layer 186 serving as a charge injecting layer, and is provided with the hole transporting layer 183 and the electron transporting layer 185 serving as a charge transporting layer.

The hole transporting layer 183 is formed of an organic material, and the anode 181 is formed of ITO, an inorganic material. Due to a difference between such an organic material and such an inorganic material, an interfacial property of the hole injecting layer 182 and the anode 181 is deteriorated, resulting in hindering holes from being smoothly injected into the hole transporting layer 183 from the anode 181. The hole injecting layer 182 enhances an interfacial property by reducing a surface energy difference between the hole transporting layer 183 and the anode 181. And the hole injecting layer 182 sets a work function level of the hole injecting layer 182 as an intermediate value between a work function level of the anode 181 and a HOMO level of the hole transporting layer 183, thereby reducing an energy difference there between. As the interfacial characteristic between the hole transporting layer 183 and the anode 181 is enhanced, and as the energy difference between the work function level of the anode 181 and the HOMO level of the hole transporting layer 183 is reduced, holes are smoothly injected into the hole transporting layer 183 from the anode 181.

Further, as a work function level of the electron injecting layer 186 is set as an intermediate value between a work function level of the cathode 188 and a LUMO level of the electron transporting layer 185, an energy difference there between is reduced. As the energy difference between the work function level of the cathode 188 and the LUMO level of the electron transporting layer 185 is reduced, electrons are smoothly injected into the electron transporting layer 185 from the cathode 188.

Further, the hole transporting layer 183 and the electron transporting layer 185 control a bonding region between holes and electrons by controlling a mobility of the holes and the electrons. Since holes have a higher mobility than electrons within an organic material, the hole transporting layer 183 and the electron transporting layer 185 control the electrons to have a higher mobility than the holes. This may allow the electrons to rapidly move into a collision radius where they are re-bonded with the holes, thereby enhancing the light emitting efficiency.

Figure 3:
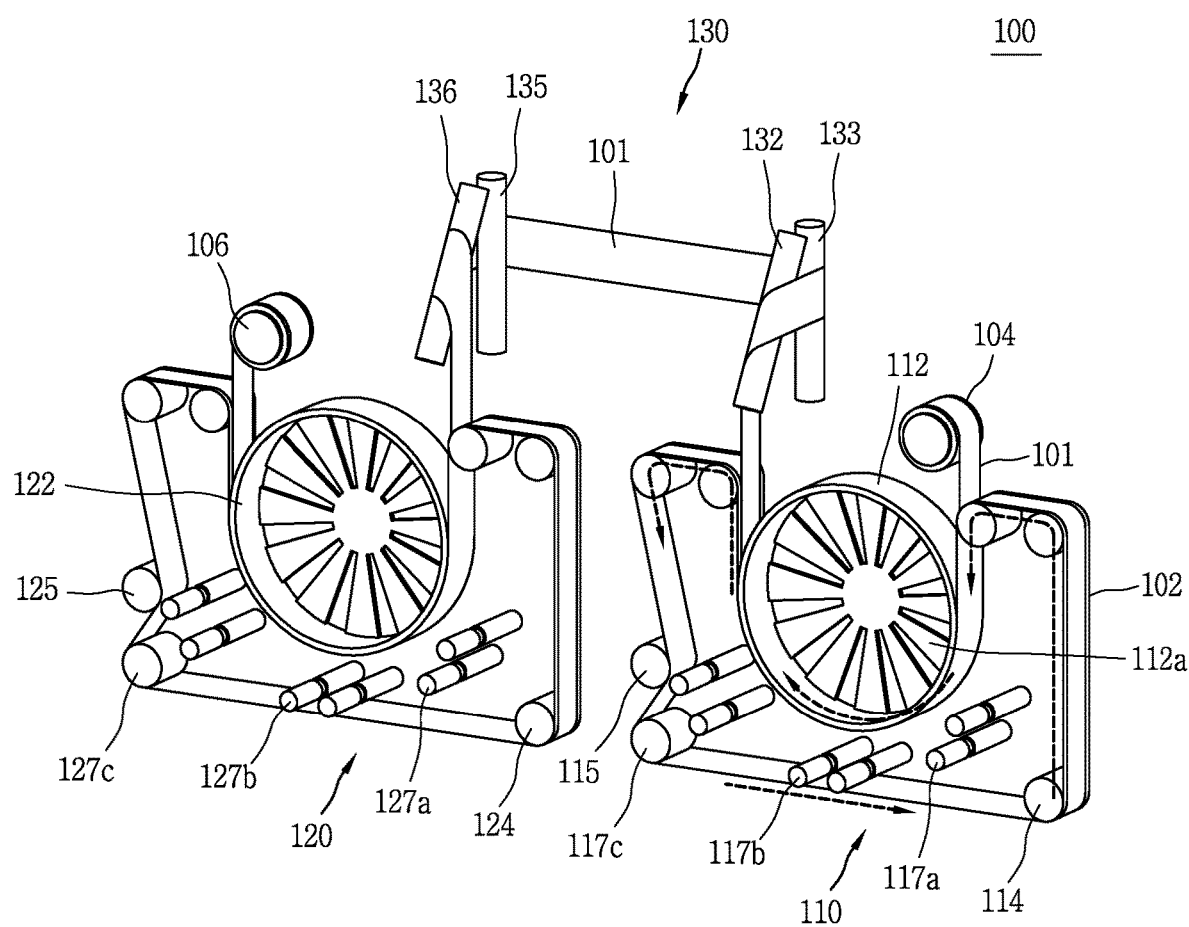
FIG. 3 is a perspective view showing a roll to roll fabricating system according to an aspect of the present disclosure, which is for fabricating the organic light emitting device shown in FIG. 2.

FIG. 3 is a perspective view showing the roll to roll fabricating system 100 according to an aspect of the present disclosure, which is for fabricating the organic light emitting device shown in FIG. 2.

As shown in FIG. 3, the roll to roll fabricating system 100 according to an aspect of the present disclosure includes a first deposition unit 110 for forming a hole injecting layer, a hole transporting layer and an organic light emitting layer by depositing a hole injecting material, a hole transporting material and an organic light emitting material; a second deposition unit 120 for forming an electron transporting layer, an electron injecting layer and a cathode by depositing an electron transporting material, an electron injecting material and a metal; and a turning unit 130 for turning the film 101 deposited at the first deposition unit 110 and transferred to the second deposition unit 120.

The roll to roll fabricating system 100 is provided with a film supplying roll 104 and a film collecting roll 106. The film 101 wound on the film supplying roll 104 is supplied to the first deposition unit 110, and the film 101 output from the second deposition unit 120 is collected by being wound on the film collecting roll 106. Although not shown, the film supplying roll 104 and the film collecting roll 106 are connected to an external driving means through a rotation shaft, and are rotated as an external driving force is transferred thereto.

As the film 101 supplied from the film supplying roll 104 is input to the first deposition unit 110, a hole injecting material, a hole transporting material and an organic light emitting material are deposited to form a hole injecting layer, a hole transporting layer and an organic light emitting layer. After the hole injecting layer, the hole transporting layer and the organic light emitting layer are output, they are input to the second deposition unit 120. Then, an electron transporting material, an electron injecting material and a metal are deposited to form an electron transporting layer, an electron injecting layer and a cathode. As a result, the organic light emitting device shown in FIG. 2 is fabricated. Here, the cathode may be formed at a processing line before the roll to roll fabricating system 100. Although not shown, the cathode is formed on the film 101 through a processing line before a roll to roll process, the film 101 having the cathode thereon is wound on the film supplying roll 104, and then the organic light emitting device is completed through the first deposition unit 110 and the second deposition unit 120.

The first deposition unit 110 includes a first deposition drum 112 for depositing the film 101 transferred from the film supplying roll 104 by winding thereon; a plurality of first mask driving rolls 114 driven by being synchronized with the film supplying roll 104, and configured to arrange an open mask 102 on the entire surface of the film 101 wound on the first deposition drum 112; and a plurality of first evaporators 117a,117b,117c disposed to face an outer surface of the first deposition drum 112, and configured to deposit vapor on the film 101 wound on the first deposition drum 112.

The film 101 is wound on the first deposition drum 112 such that its non-deposition surface contacts a surface of the first deposition drum 112. And the open mask 102 is adhered to a deposition surface of the film 101, thereby being wound on the first deposition drum 112. Since the film supplying roll 104 and the mask driving rolls 114 are driven in a synchronized state, the film 101 and the open mask 102 are wound on the first deposition drum 112 in an aligned state in the first deposition unit 110. The first deposition unit 110 is provided with a first tension roll 115 such that the open mask 102 is always arranged on the entire surface of the film 101 in a tensioned state.

Figure 4A:
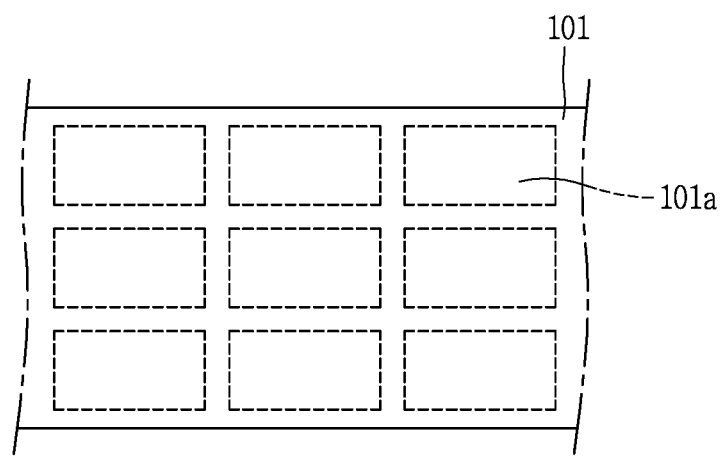
FIGS. 4A and 4B are schematic views showing a structure of a film and an open mask, respectively.
Figure 4B:
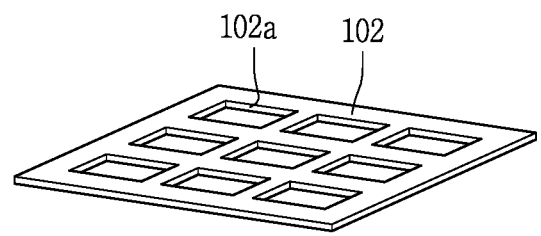

FIGS. 4A and 4B are schematic views showing a structure of the film 101 and the open mask 102, respectively.

As shown in FIG. 4A, the film 101, a mother substrate having a plurality of organic light emitting device forming regions 101a, is long extended to have a preset width. 'n×m' organic light emitting device forming regions 101a (where 'n' and 'm' are integers more than 1) are arranged on the film 101, with a preset interval there between.

As shown in FIG. 4B, the open mask 102 is formed to have a shape corresponding to that of the film 101, and is provided therein with a plurality of open regions 102a. The open regions 102a correspond to the organic light emitting device forming regions 101a of the film 101. When the open mask 102 is arranged on the entire surface of the film 101, the organic light emitting device forming regions 101a are exposed to the outside through the open mask 102. As a result, a deposition material is deposited only on the exposed regions.

Referring to FIG. 3 again, the first deposition drum 112 is a region where the film 101 transferred from the film supplying role 104 is wound and a deposition process is substantially performed. As shown in FIG. 2, a deposition process may be performed on the film transferred between the film supplying roll and the film collecting roll of the roll to roll fabricating system. However, in the present disclosure, a deposition process is performed on the film 101 wound on the second deposition drum 122, due to the following reasons.

As shown in FIG. 2, in case of performing a deposition process on the film 1 transferred between the film supplying roll 12 and the film collecting roll 14, a tension of the film is maintained by the film supplying roll 12 and the film collecting roll 14. However, since a substantial deposition region is in a floated state, the tension of the film 1 may not be maintained. Especially, if the film supplying roll 12 and the film collecting roll 14 have a transformation by an external impact, or if the film supplying roll 12 and the film collecting roll 14 are not synchronized with each other, the film 1 may become loose or may have wrinkles.

If the film 1 becomes loose or has wrinkles, a deposition material is not deposited on a preset position of the film 1, and a bonding force of the deposition material on the film 1 is lowered. Moreover, since the plurality of evaporators which form a plurality of layers are arranged in a horizontal direction in a moving direction of the film, a space of the deposition units is increased.

However, in the present disclosure, in case of performing a deposition process by winding the film 101 on the first deposition drum 112, the film 101 always contacts the first deposition drum 112. This can prevent the film 101 from becoming loose or prevent wrinkles from occurring on the film 101, thereby allowing a deposition material to be deposited on a preset position.

Further, a plurality of first evaporators 117a, 117b, 117c are spaced from a circumference of the first deposition drum 112 by the same distance. Since the plurality of first evaporators 117a, 117b, 117c are arranged on a curved surface not on a planar surface along the circumference of the first deposition drum 112, a space of the first deposition unit 110 may be minimized.

Further, the first deposition drum 112 prevents a temperature increase of the film 101 by high-temperature heat, during a deposition process. The first deposition drum 112 is formed to have a diameter much larger than that of the film supplying roll 104 or the film collecting roll 106, and is formed of a material having a high thermal conductivity (e.g., a metal). And a deposition process is performed in a state that the film 101 contacts the first deposition drum 112. If the film 101 is heated to have its temperature increased during a deposition process performed at a high temperature, heat applied to the film 101 is discharged through the first deposition drum 112 contacting the film 101, resulting in cooling the film 101. This can prevent a deformation and lowering of a tension of the film 101, due to a temperature increase.

As shown, an outer circumferential surface of the first deposition drum 112 which contacts the film 101 is formed of a thin metallic plate, and the outer circumferential surface is supported only by a plurality of supporting plates 112a having a thin plate shape and arranged on one side surface of the cylindrical first deposition drum 112. Since the inside of the outer circumferential surface of the first deposition drum 112 is exposed to air, heat transferred to the first deposition drum 112 from the film 101 may be efficiently emitted to the outside to enhance cooling efficiency.

Although not shown, an additional cooling means may be provided at the first deposition drum 112 in order to more enhance cooling efficiency of the film 101. For instance, a passage along which a refrigerant such as water flows is formed in the outer circumferential surface of the first deposition drum 112, thereby cooling the film 101 more efficiently.

A hole injecting material evaporator 117a, a hole transporting material evaporator 117b, and an organic light emitting material evaporator 117c are provided at the first deposition unit 110.

The second deposition unit 120 has the similar configuration as the first deposition unit 110, except for a deposition material deposited by second evaporators 127a, 127b, 127c. That is, the second deposition unit 120 includes: a second deposition drum 122 for depositing the film 101 transferred after being deposited in the first deposition unit 110 by winding the film thereon; a plurality of second mask driving rolls 124 driven by being synchronized with the film supplying roll 104, and configured to arrange the open mask 102 on an entire surface of the film 101 wound on the second deposition drum 122; and a plurality of second evaporators 127a, 127b, 127c disposed to face an outer surface of the second deposition drum 122, and configured to deposit vapor on the film 101 wound on the second deposition drum 122. The second evaporators 127a, 127b, 127c include an electron transporting material evaporator 127a, an electron injecting material evaporator 127b, and a cathode forming metal evaporator 127c.

The number of evaporators disposed at the first deposition unit 110 and the second deposition unit 120 may be variously set. For instance, a hole injecting material evaporator, a hole transporting material evaporator, an organic light emitting material evaporator, and an electron transporting material evaporator may be provided at the first evaporation unit 110, and only an electron injecting material evaporator and a cathode forming metal evaporator may be provided at the second evaporation unit 120. Alternatively, a hole injecting material evaporator and a hole transporting material evaporator may be provided at the first evaporation unit 110, and an organic light emitting material evaporator, an electron transporting material evaporator, an electron injecting material evaporator, and a cathode forming metal evaporator may be provided at the second evaporation unit 120.

In case of the roll to roll fabricating system, it is most preferable to implement all configurations within a single deposition unit by arranging all evaporators at the single deposition unit. However, in this case, as the number of evaporators corresponding to a single deposition drum is increased and the deposition drum has its size significantly increased, such a configuration is inefficient.

Accordingly, a plurality of deposition units 110, 120 is provided, and a proper number of evaporators at each of the deposition units 110, 120 is arranged. The number of evaporators arranged at each of the deposition units 110, 120, a position, etc. may be variously controlled according to a structure, a size, etc. of an organic light emitting device to be fabricated.

The turning unit 130 is disposed at a middle region of a transfer path of the film 101 transferred to the second deposition unit 120 from the first deposition unit 110. And the turning unit 130 guides the film 101 output from the first deposition unit 110 in a state that a deposition surface and a non-deposition surface of the film 101 are turned, thereby supplying the film 101 to the second deposition unit 120.

As shown in FIG. 3, the turning unit 130 includes a plurality of turning rolls 132,133,135,136. In the drawings, the turning unit 130 includes four turning rolls 132,133,135, 136. However, five or more turning rolls, or three or less turning rolls may be provided.

A first turning roll 132 and a second turning roll 133 are configured to primarily turn a deposition surface and a non-deposition surface of the film 101 output after being deposited at the first deposition unit 110. And a third turning roll 135 and a fourth turning roll 136 are configured to secondarily turn the film 101 turned by the first and second turning rolls 132, 133.

The film 101 secondarily turned by the third and fourth turning rolls 135, 136 is input to the second deposition unit 120, and is wound on the second deposition drum 122. Like the first deposition drum 112, the second deposition drum 122 contacts a non-deposition surface of the film 101 wound thereon. And a deposition surface of the film 101 is towards the outside such that a deposition material is deposited thereon.

As aforementioned, in the present disclosure, the turning unit 130 is provided between the first and second deposition units 110, 120 such that the film 101 output from the first deposition unit 110 is input to the second deposition unit 120. Hereinafter, the function of the turning unit 130 will be explained in more detail.

Figure 5:
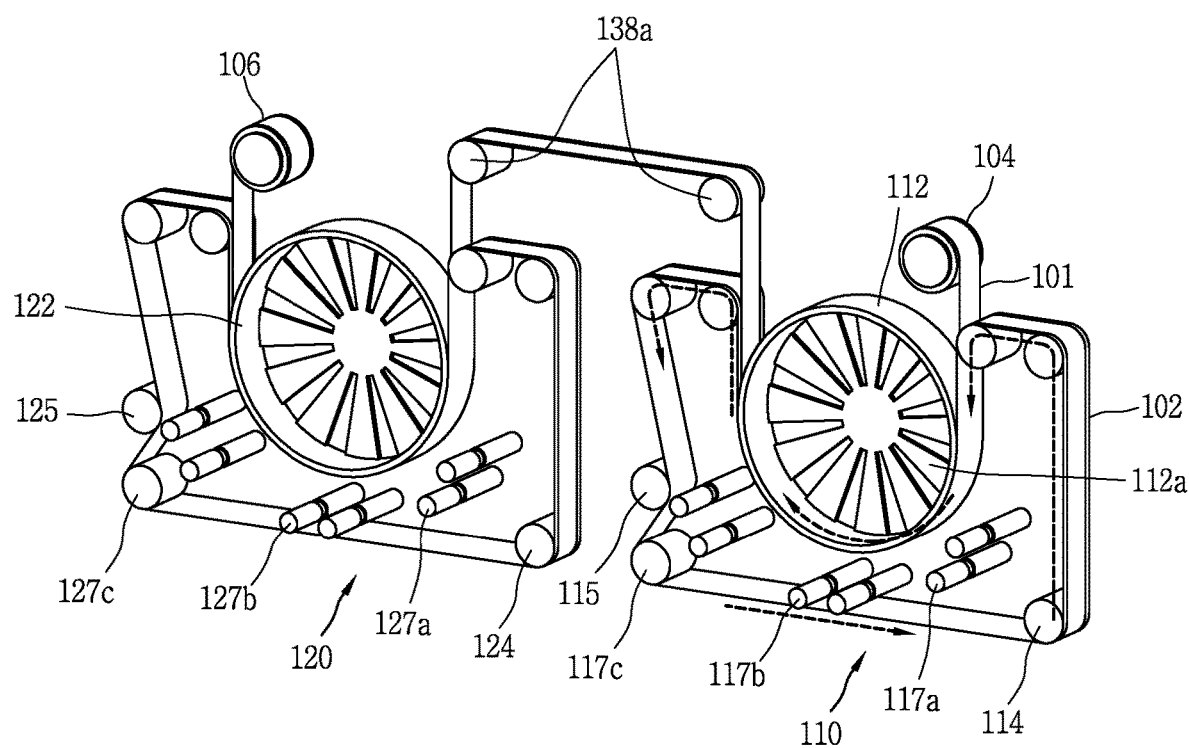
FIG. 5 is a perspective view showing a structure of a roll to roll fabricating system having no turning unit.

FIG. 5 is a perspective view showing a structure of a roll to roll fabricating system not provided with the turning unit shown in FIG. 3. As shown in FIG. 5, in this structure, guide rolls 138a, 138b for guiding the film 101 output from the first deposition unit 110 to the second deposition unit 120 are provided instead of the turning unit shown in FIG. 3.

In the roll to roll fabricating system having the structure, the film 101 output after being deposited at the first deposition unit 110 is guided by the guide rolls 138a, 138b to be input to the second deposition unit 120. When the film 101 is guided, a deposition surface of the film 101 having thereon a hole injecting layer, a hole transporting layer and an organic light emitting layer contacts surfaces of the guide rolls 138a, 138b at the first deposition unit 110.

The contact between the deposition surface of the film 101 and the guide rolls 138a,138b causes the laminated hole injecting layer, hole transporting layer and organic light emitting layer to be damaged, and makes a layer laminated later on the film 101 deteriorated due to foreign materials which remain on the deposition surface of the film 101.

In order to solve such problems, the turning unit 130 is provided in the present disclosure. That is, as shown in FIG. 3, when the film 101 output from the first deposition unit 110 is guided by the first to fourth turning rolls 132,133,135,136 of the turning unit 130, a deposition surface and a non-deposition surface of the film 101 are turned. As a result, the film 101 is guided without contacting the first to fourth turning rolls 132,133,135,136.

That is, since the deposition surface of the film 101 does not contact any structure including a roll until the film 101 output from the first deposition unit 110 is input to the second deposition unit 120, an inferiority of the film 101 due to a deposited layer or foreign materials can be prevented.

The first to fourth turning rolls 132,133,135,136 of the turning unit 130 not only turn and guide the film 101, but also serve as a buffer which synchronizes the first and second deposition units 110, 120 with each other. When the film 101 is deposited at the first and second deposition units 110, 120, the first and second deposition units 110, 120 are not synchronized with each other due to their different deposition speeds.

For instance, when the film 101 is transferred to the second deposition unit 120 and is deposited at the second deposition unit 120 not at the first deposition unit 110, a transfer speed of the film 101 should be lowered or the film 101 should be stopped from being transferred, at the second deposition unit 120. This may cause interference between transfer of the film 101 at the first deposition unit 110 and transfer of the film 101 at the second deposition unit 120. In order to prevent such interference, a transfer speed of the film at the first deposition unit 110 should be controlled as the film 101 is transferred at the second deposition unit 120. This requires a control system for controlling a driving of the film supplying roll 104, the first deposition drum 112 and the mask driving rolls 114. Further, in order to control a speed of the film supplying roll 104, the first deposition drum 112 and the mask driving rolls 114 under control of the control system, required is a speed variable motor for driving the film supplying roll 104, the first deposition drum 112 and the mask driving rolls 114.

In the present disclosure, interference between a transfer speed of the film 101 at the first deposition unit 110 and a transfer speed of the film 101 at the second deposition unit 120 is prevented by synchronizing the first and second deposition units 110, 120 with each other, by using the turning unit 130 as a kind of buffer, without using an additional roll driving control system. For this, in the present disclosure, the first to fourth turning rolls 132,133,135,136 are moveably installed such that a relative interval there between is increased or decreased. And the first to fourth turning rolls 132,133,135,136 are moved according to whether the first and second deposition units 110, 120 have performed a deposition process, thereby synchronizing the first and second deposition units 110, 120 with each other.

For instance, if the film 101 is transferred at the first deposition unit 110 without being deposited, and if the film 101 is deposited only at the second deposition unit 120, the second deposition drum 122 and the second mask driving rolls 124 of the second deposition unit 120 have their driving speed lowered or have their driving stopped. However, since the first deposition drum 112 and the first mask driving rolls 114 of the first deposition unit 110 are driven at their original speed, interference occurs between a transfer speed of the film 101 at the first deposition unit 110 and a transfer speed of the film 101 at the second deposition unit 120. As a result, a tension of the film 101 is lowered, and wrinkles are generated.

In order to solve such problems, the first to fourth turning rolls 132,133,135,136 are moved in a direction that an interval there between is increased, thereby accommodating the film 101 transferred by the first deposition unit 110 into the turning unit 130. This may allow the film 101 to always maintain a constant tension even when the second deposition drum 122 and the second mask driving rolls 124 have their driving speed lowered or have their driving stopped, whereas the first deposition drum 112 and the first mask driving rolls 114 are driven at their original speed.

Here, a moving range and a moving speed of the first to fourth turning rolls 132,133,135,136 may be determined according to a deposition time at the second deposition unit 120 (i.e., a transfer speed of the film 101 at the second deposition unit 120).

As aforementioned, in the present disclosure, a plurality of deposition units having a deposition drum are provided to perform a deposition process in a state that a film is wound on the deposition drum. Especially, when a plurality of deposition units are provided, a turning unit is provided between the deposition units. This may prevent damage of a deposited layer resulting from a contact between a deposition surface of the film and another roll, or deterioration of the film due to foreign materials.

The deposition unit may be installed in various numbers according to a structure of an organic light emitting device to be fabricated. And the turning unit may be also installed in various numbers according to the installed deposition units.

Figure 6:
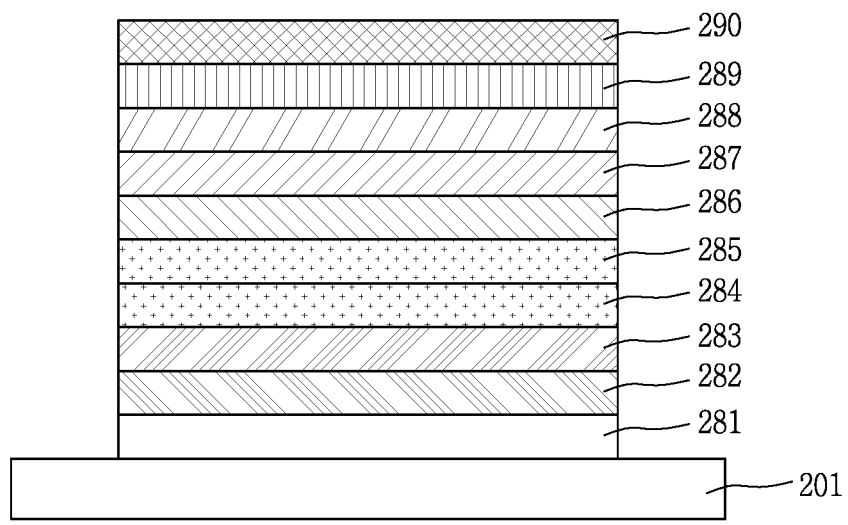
FIG. 6 is a cross-sectional view showing another structure of an organic light emitting device.
Figure 7:
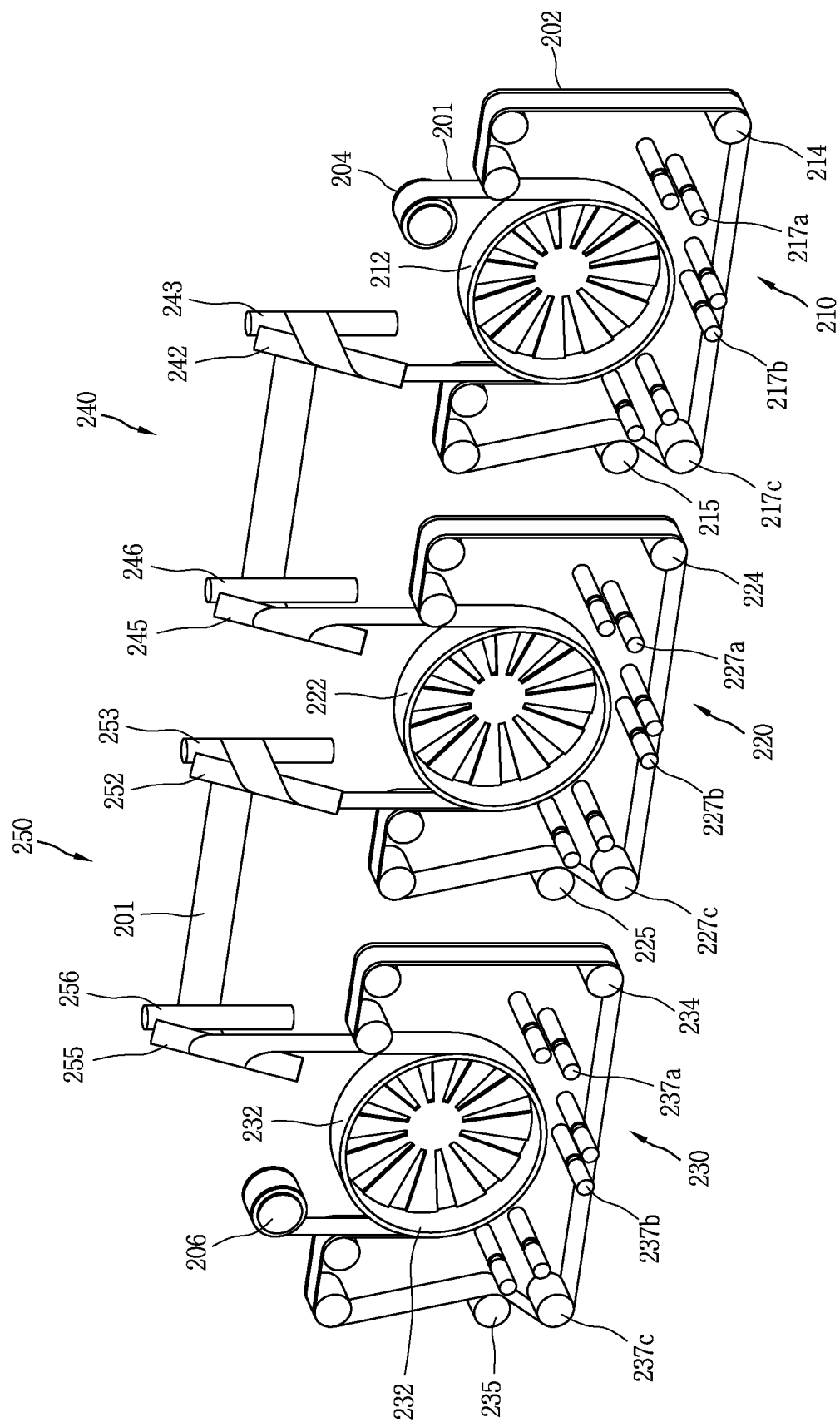
FIG. 7 is a perspective view showing a roll to roll fabricating system according to another aspect of the present disclosure, which is for fabricating the organic light emitting device shown in FIG. 6.

FIG. 6 is a cross-sectional view showing another structure of an organic light emitting device according to the present disclosure. And FIG. 7 is a view showing a roll to roll fabricating system, which is for fabricating the organic light emitting device shown in FIG. 6. The roll to roll fabricating system has its structure changed as an organic light emitting device to be fabricated has its structure changed.

As shown in FIG. 6, an organic light emitting device includes an anode 281 disposed on a film 201, a hole injecting layer 282 formed on the anode 281, a hole transporting layer 283 formed on the hole injecting layer 282 and configured to transport injected holes, a first organic light emitting layer 284 disposed on the hole transporting layer 283, a second organic light emitting layer 285 disposed on the first organic light emitting layer 284, an electron transporting layer 286 disposed on the second organic light emitting layer 285, an electron injecting layer 287 disposed on the electron transporting layer 286, a buffer layer 288 disposed on the electron injecting layer 287, a cathode 289 disposed on the buffer layer 288, and an encapsulating layer 290 disposed on the cathode 289.

In the organic light emitting device having such a structure, 9 layers, i.e., the hole injecting layer 282, the hole transporting layer 283, the first organic light emitting layer 284, the second organic light emitting layer 285, the electron transporting layer 286, the electron injecting layer 287, the buffer layer 288, the cathode 289 and the encapsulating layer 290, are disposed on the anode 281 disposed on the film 201.

In order to fabricate the organic light emitting device having such a structure, a roll to roll fabricating system having 3 deposition units 210, 220, 230 is required as shown in FIG. 7. A roll to roll fabricating system having 2 deposition units may be used. However, in this case, one deposition unit should be provided with 4 or 5 evaporators, resulting in lowering deposition efficiency.

As shown in FIG. 7, the roll to roll fabricating system according to an aspect of the disclosure includes a film supplying roll 204 for supplying the film 201; a film collecting roll 206 for collecting the film 201; first to third evaporators 210,220,230 for depositing the film 201 supplied from the film supplying roll 204; a first turning unit 240 disposed between the first deposition unit 210 and the second deposition unit 220, and for turning the film 201 deposited at the first deposition unit 210 and supplying the film 201 to the second deposition unit 220; and a second turning unit 250 disposed between the second deposition unit 220 and the third deposition unit 230, and for turning the film 201 deposited at the second deposition unit 220 and supplying the film 201 to the third deposition unit 230.

The first to third deposition units 210, 220, 230 have the similar configuration as the first and second deposition units 110, 120 shown in FIG. 3, and the first and second turning units 240, 250 have the same configuration as the turning unit 130 shown in FIG. 3. A deposition material deposited at the first to third deposition units 210, 220, 230 according to an aspect of the disclosure is different from that deposited at the first and second deposition units 110, 120 shown in FIG. 3, under the same structure. Therefore, detailed explanations about the first to third deposition units 210, 220, 230 and the first and second turning units 240, 250 will be omitted.

In the roll to roll fabricating system according to an aspect of the disclosure, the first turning unit 240 is arranged between the first and second deposition units 210, 220, and the second turning unit 220 is arranged between the second and third deposition units 220, 230. This may prevent a deposition surface of the film 202 having thereon a deposition material deposited at the first and second deposition units 210, 220, from contacting any structure, thereby preventing damage of a deposited layer or deterioration of the film due to foreign materials.

In the drawings, illustrated is the roll to roll fabricating system having 3 deposition units and 2 turning units provided there among. However, the present disclosure is not limited to this, and may be applicable to a roll to roll fabricating system having a plurality of deposition units and turning units according to a lamination structure of an organic light emitting device.

As the present features may be embodied in several forms without departing from the characteristics thereof, it should also be understood that the above-described aspects are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A roll to roll fabricating system, comprising:
a film supplying roll supplying a film;
a film collecting roll collecting the film;
first and second deposition units between the film supplying roll,
wherein the first deposition unit includes a first deposition drum for depositing the film transferred from the film supplying roll by winding thereon, a plurality of first mask driving rolls configured to arrange a first open mask on an entire surface of the film wound on the first deposition drum, and contacting a first surface of the first open mask, a first tension roll between the plurality of the first mask driving rolls to apply tension to the first open mask by pressing a second surface of the wound first open mask and a plurality of first evaporators disposed to face an outer surface of the first deposition drum, spaced from a circumference of the first deposition drum by the same distance, and configured to deposit vapor on the film wound on the first deposition drum,
wherein the second deposition unit includes a second deposition drum for depositing the film transferred after being deposited in the first deposition unit by winding the film thereon, a plurality of second mask driving rolls configured to arrange a second open mask on the entire surface of the film wound on the second deposition drum, and contacting a first surface of the second open mask, a second tension roll between the plurality of the second mask driving rolls to apply tension to the second open mask by pressing a second surface of the wound second open mask and a plurality of second evaporators disposed to face an outer surface of the second deposition drum, spaced from a circumference of the second deposition drum by the same distance and configured to deposit vapor on the film wound on the second deposition drum,
wherein the plurality of first evaporators include at least one of a hole injecting material evaporator, a hole transporting material evaporator, and an organic light emitting material evaporator, and
wherein the plurality of second evaporators include at least one of an electron transporting material evaporator, an electron injecting material evaporator, and a cathode forming metal evaporator;
a turning unit including first and second turning rolls and third and fourth turning rolls between the deposition units and turning a deposition surface of the film from the first and second deposition units such that the deposition surface of the film is not contact with the film supplying roll and the film collecting roll,
wherein the first and second turning rolls guides to turn the film from the first deposition unit in a first moving direction to a second moving direction that is perpendicular to the first moving direction, and the third and fourth turning rolls guides to turn the film in the second moving direction to a third moving direction that is perpendicular to the second moving direction,
wherein, when a transfer speed of the first deposition unit is normal and a transfer speed of the second deposition unit is lowered or stopped, the first to fourth turning rolls are movable such that a relative distance among the first to fourth turning rolls is increased, and a movement of the first to fourth turning rolls is determined in accordance with a deposition time at the first and second deposition units to synchronize the first and second deposition units,
wherein the film supplying roll, the film collecting roll, and the turning unit are located above the first and second deposition units, and
wherein the second and third turning rolls are vertically disposed with respect to the second moving direction and the first and fourth turning rolls are inclined against the second and third turning rolls, respectively.

2. The roll to roll fabricating system of claim 1, wherein the deposition drum cools down the wound film.

3. The roll to roll fabricating system of claim 2, wherein the deposition drum comprises a cooler cooling down the film.

4. The roll to roll fabricating system of claim 3, wherein the cooler comprises a refrigerant.

* * * * *